US 12,368,019 B2

(12) United States Patent
Zur

(10) Patent No.: US 12,368,019 B2
(45) Date of Patent: Jul. 22, 2025

(54) OPTIMIZED SADDLE NOZZLE DESIGN FOR GAS INJECTION SYSTEM

(71) Applicant: APPLIED MATERIALS ISRAEL LTD., Rehovot (IL)

(72) Inventor: Yehuda Zur, Tel-Aviv (IL)

(73) Assignee: Applied Materials Israel Ltd., Rehovot (IL)

( * ) Notice: Subject to any disclaimer, the term of this patent is extended or adjusted under 35 U.S.C. 154(b) by 527 days.

(21) Appl. No.: 17/945,338

(22) Filed: Sep. 15, 2022

(65) Prior Publication Data

US 2024/0096592 A1    Mar. 21, 2024

(51) Int. Cl.
*C23C 14/22* (2006.01)
*H01J 37/147* (2006.01)
(Continued)

(52) U.S. Cl.
CPC ........ *H01J 37/3178* (2013.01); *C23C 14/221* (2013.01); *H01J 37/1474* (2013.01); *H01J 2237/006* (2013.01); *H01L 21/28568* (2013.01)

(58) Field of Classification Search
CPC .............. C23C 14/221; H01J 2237/006; H01J 2237/31713; H01J 37/02
See application file for complete search history.

(56) References Cited

U.S. PATENT DOCUMENTS 6,670,610 B2    12/2003    Shemesh et al.
6,992,288 B2 *   1/2006    Cafri ..................... H01J 37/026
                                                  250/306
(Continued)

FOREIGN PATENT DOCUMENTS

WO    2017203553 A1    11/2017

OTHER PUBLICATIONS

PCT/US2023/072847, "International Search Report and the Written Opinion", Dec. 27, 2023, 8 pages.
(Continued)

*Primary Examiner* — Jaehwan Oh
(74) *Attorney, Agent, or Firm* — Kilpatrick Townsend & Stockton LLP

(57) ABSTRACT

A gas injection nozzle that includes an elongated gas conduit that comprises: a first gas conduit segment configured to be coupled with a gas reservoir; a second gas conduit segment fluidly coupled to the first gas conduit segment and defining a downward curve of the elongated gas conduit; a third gas conduit segment defining an upward curve of the elongated gas conduit that extends to a sealed end and is disposed in a mirrored relationship with at least a portion of the second gas conduit; and a central gas conduit segment coupled between the second and third gas conduit segments, the central gas conduit segment having a first aperture formed in an upper surface of the central gas conduit and a second aperture, larger than the first aperture, formed in a lower surface of the central gas conduit directly across from the first aperture, wherein the elongated gas conduit has a first diameter along a portion of its length that includes at least the second, third and central gas conduit segments and wherein the central gas conduit segment includes a substantially horizontal portion that extends on each side of the first and second apertures for a distance that is at least twice the first diameter of the gas conduit.

20 Claims, 8 Drawing Sheets

(51) Int. Cl.
  *H01J 37/317*   (2006.01)
  *H01L 21/285*   (2006.01)

(56) References Cited

U.S. PATENT DOCUMENTS

| | | |
|---|---|---|
| 8,709,269 B2 | 4/2014 | Shemesh |
| 2002/0053638 A1 | 5/2002 | Winkler et al. |
| 2002/0102861 A1* | 8/2002 | Bassom ................ H10D 1/474 |
| | | 438/785 |
| 2005/0072664 A1 | 4/2005 | Brucker et al. |
| 2005/0199806 A1* | 9/2005 | Cafri .................... H01J 37/026 |
| | | 250/306 |
| 2016/0042909 A1 | 2/2016 | Gwinn et al. |
| 2020/0258718 A1 | 8/2020 | Wang et al. |

OTHER PUBLICATIONS

PCT/US2023/072847, "International Preliminary Report on Patentability", Mar. 27, 2025, 5 pages.

\* cited by examiner

OPTIMIZED SADDLE NOZZLE DESIGN FOR GAS INJECTION SYSTEM

BACKGROUND OF THE INVENTION

In the study of electronic materials and processes for fabricating such materials into an electronic structure, a specimen of the electronic structure can be used for microscopic examination for purposes of failure analysis and device validation. For instance, a specimen such as a silicon, gallium nitride or other type of wafer that includes one or more integrated circuits (ICs) or other electronic structures formed thereon can be milled with a focused ion beam (FIB) and/or analyzed with a scanning electron microscope (SEM) to study specific characteristics of the circuits or other structures formed on the wafer.

FIB and SEM tools are similar in that each includes a charged particle column that generates a charged particle beam and directs the beam towards a sample. As their names imply, however, the charged particle beam generated by an FIB column is a focused beam of ions while the charged particle beam generated by an SEM column is a focused beam of electrons.

While FIB and SEM tools (as well as FIB-SEM tools, which include both a FIB column and a SEM column) are often used for analyzing and otherwise evaluating structures within a specimen, the tools can also be used for etching or depositing material on a specimen. For example, a focused ion beam can be scanned across a surface of a sample while a gas injection system directs a flow of a deposition precursor gas to the scanned area to selectively deposit material, with nanometer precision, in the scanned area according to a technique that is often referred to as focused ion beam enhanced deposition or FIB-enhanced deposition for short. During a FIB-enhanced deposition process, molecules of the injected gas adhere to a surface of the sample. As the ion beam is scanned across a region of the sample, the energy released by the collision cascade of the bombarding ions causes dissociation of the surface-adsorbed precursor molecules, resulting in sold deposition on the surface together with the release of volatile residues. As another example, a deposition gas can be introduced to a sample in the vicinity in which an electron beam is scanned across the surface of a sample in order to deposit material under an SEM column.

While FIB-enhanced deposition has been used in many different instances and applications, improved deposition techniques are continuously being sought.

BRIEF SUMMARY OF THE INVENTION

Embodiments of the disclosure pertain to an improved method and system for charged particle beam enhanced deposition, such as focused ion beam enhanced deposition. Embodiments can be used to increase the deposition rate of charged particle beam enhanced deposition and thereby increase the throughput of processes that employ charged particle beam enhanced deposition. Embodiments can also provide a highly symmetric gas flow around the optical axis of a charged particle beam thus reducing any potential "shadow effects" generated during the deposition process. While embodiments of the disclosure can be used to increase the rate at which materials are deposited over a variety of different types of samples, some embodiments are particularly useful in depositing materials over samples that are semiconductor wafers or similar specimens.

In some embodiments, a gas injection nozzle that includes an elongated gas conduit is provided. The elongated gas conduit can include: a first gas conduit segment configured to be coupled with a gas reservoir; a second gas conduit segment fluidly coupled to the first gas conduit segment and defining a downward curve of the elongated gas conduit; a third gas conduit segment defining an upward curve of the elongated gas conduit that extends to a sealed end and is disposed in a mirrored relationship with at least a portion of the second gas conduit; and a central gas conduit segment coupled between the second and third gas conduit segments. The central gas conduit segment can have a first aperture formed in an upper surface of the central gas conduit and a second aperture, larger than the first aperture, formed in a lower surface of the central gas conduit directly across from the first aperture. Additionally, the elongated gas conduit can have a inner diameter along a portion of its length that includes at least the second, third and central gas conduit segments and the central gas conduit segment can include a substantially horizontal portion that extends on each side of the first and second apertures for a distance that is at least twice the inner diameter of the gas conduit.

In some embodiments, a system for depositing material over a sample in a localized region of the sample is provided. The system can include: a vacuum chamber; a sample support configured to hold a sample within the vacuum chamber during a sample evaluation process; a charged particle beam column configured to direct a charged particle beam into the vacuum chamber toward the sample such that the charged particle beam collides with the sample in a deposition region; and a gas injection system configured to deliver a process gas to the deposition region of the sample. The gas injection system can include an elongated gas conduit comprising: a first gas conduit segment configured to be coupled with a gas reservoir; a second gas conduit segment fluidly coupled to the first gas conduit segment and defining a downward curve of the elongated gas conduit; a third gas conduit segment defining an upward curve of the elongated gas conduit that extends to a sealed end and is disposed in a mirrored relationship with at least a portion of the second gas conduit; and a central gas conduit segment coupled between the second and third gas conduit segments. The central gas conduit segment can have a first aperture formed in an upper surface of the central gas conduit and a second aperture, larger than the first aperture, formed in a lower surface of the central gas conduit directly across from the first aperture. The elongated gas conduit can also have an inner diameter along a portion of its length that includes at least the second, third and central gas conduit segments and the central gas conduit segment can include a substantially horizontal portion that extends on each side of the first and second apertures for a distance that is at least twice the inner diameter of the gas conduit.

In some embodiments a method of depositing material over a sample in a deposition region of the sample with a charged particle beam column is provided. The method can include: positioning a sample within a vacuum chamber such that the deposition region is under a field of view of the charged particle beam column; injecting a deposition precursor gas, with a gas injection system including an elongated gas conduit, into the vacuum chamber at a location adjacent to the deposition region; generating a charged particle beam with the charged particle beam column and focusing the particle beam within the deposition region of the sample; and scanning the focused particle beam across the deposition region of the sample to activate molecules of the deposition gas that have adhered to the sample surface in the deposition region and deposit material on the sample within the deposition region. The elongated gas conduit can include the various features described above.

In various implementations, the gas injection nozzle can include one or more of the following additional features. The second aperture has a diameter that is at least twice as large as a diameter of the first aperture. The substantially horizontal portion of the central gas conduit extends on each side of the first and second apertures for a distance that is at least three times the inner diameter of the gas conduit. The elongated gas conduit comprises stainless steel. An inner diameter of the elongated gas conduit is substantially constant throughout an entire length of the elongated gas conduit. The inner diameter of the elongated gas conduit is between 1500 and 300 microns. The inner diameter of the elongated gas conduit is between 1000 and 600 microns.

To better understand the nature and advantages of the present disclosure, reference should be made to the following description and the accompanying figures. It is to be understood, however, that each of the figures is provided for the purpose of illustration only and not drawn to scale and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments of the disclosure pertain to an improved method and system for charged particle beam enhanced deposition, such as focused ion beam enhanced deposition. Embodiments can be used to increase the deposition rate of charged particle beam enhanced deposition and thereby increase the throughput of processes that employ charged particle beam enhanced deposition. In some instances, embodiments can also be used to change the chemical composition of the deposited material improving the deposition process.

Example Focused Ion Beam (FIB) Tool

Figure 1:
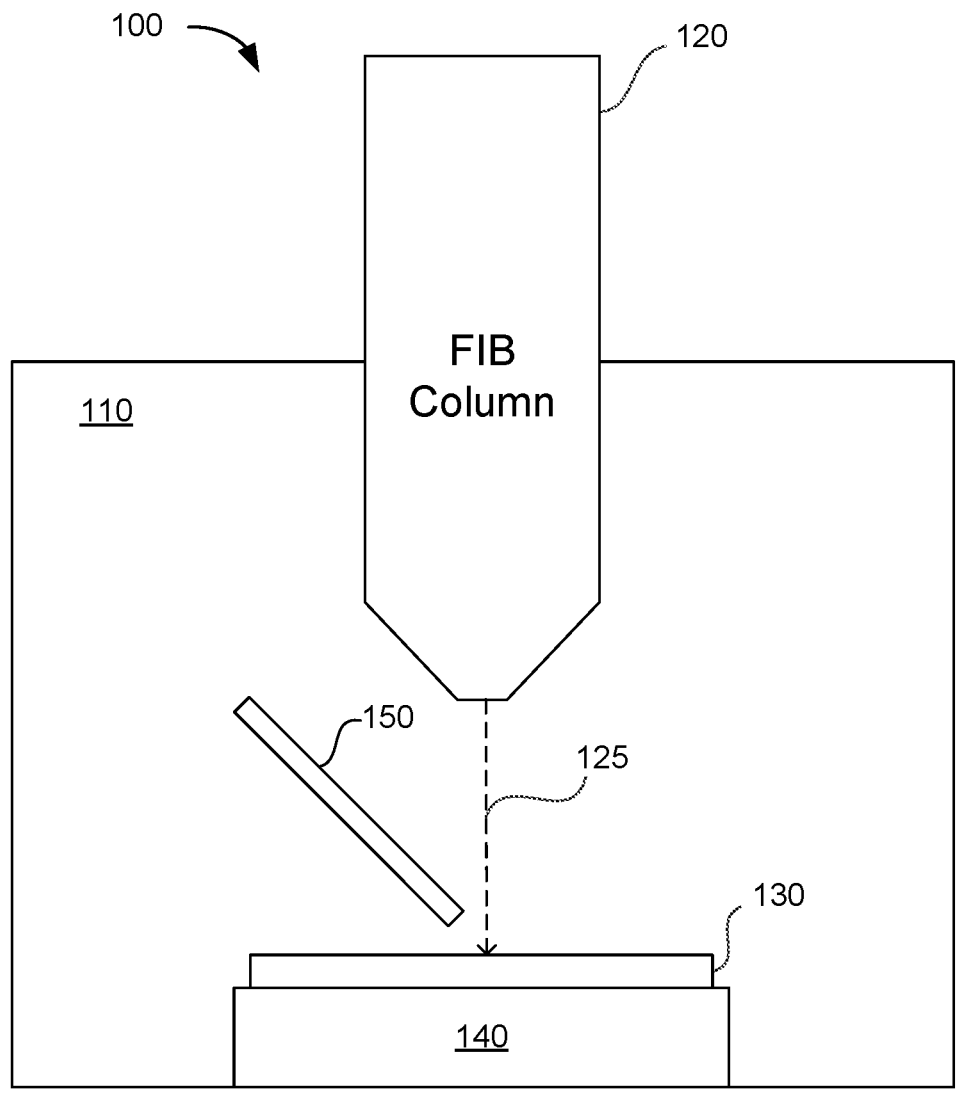
FIG. 1 is simplified schematic illustration of a sample particle beam deposition system.

In order to better understand and appreciate the disclosure, reference is first made to FIG. 1, which is a simplified schematic illustration of a previously known focused ion beam (FIB) evaluation system 100. FIB system 100 can be used for, among other operations, particle enhanced deposition of various materials over semiconductor wafers.

As shown in FIG. 1, system 100 can include, among other elements, a vacuum chamber 110 along with a focused ion beam (FIB) column 120. A supporting element 140 can support a sample 130 (e.g., a semiconductor wafer) within chamber 110 during a processing operation in which the sample 130 (sometimes referred to herein as an "object" or a "specimen") is subject to a charged particle beam from FIB column 120.

During a processing operation, one or more gases can be delivered into chamber 110 by a gas injection system 150 for certain operations. For simplicity of explanation gas injection system 150 is illustrated in FIG. 1 as a nozzle, but it is noted that gas injection system 150 can include gas reservoirs, gas sources, valves, one or more inlets and one or more outlets, among other elements. In some embodiments gas injection system 150 can be configured to deliver gas to a localized area of sample 130 that is exposed to the scan pattern of the charged particle beam as opposed to delivering gas to an entire upper surface of the sample. For example, in some embodiments gas injection system 150 has a nozzle opening diameter measured in hundreds of microns (e.g., between 400-500 microns) that is configured to deliver gas directly to a relatively small portion of the sample's surface that encompasses the charged particle beam scan pattern.

FIB column 120 is connected to vacuum chamber 110 so that the charged particle beam generated by the FIB column propagates through a vacuumed environment formed within vacuum chamber 110 before impinging on sample 130. For example, as shown in FIG. 1, FIB column 120 can generate a focused ion beam 125 that travels through the vacuum environment of chamber 110 before colliding with sample 130.

FIB column 120 can mill (e.g., drill a recess in) sample 130 by irradiating the sample with charged particle beam 125 to form a cross section and, if desired, can also smooth the cross section. An FIB milling process typically operates by positioning the specimen in a vacuum environment and emitting a focused beam of ions towards the specimen to etch or mill away material on the specimen. In some instances the vacuum environment can be purged by controlled concentration of background gases that serve to help control the etch speed and quality or help control matter deposition. The accelerated ions can be generated from Xenon, Gallium or other appropriate elements and are typically accelerated towards the specimen by voltages in the range from 500 volts to 100,000 volts, and more typically falling in the range from 3,000 volts to 30,000 volts. The beam current is typically in the range from several pico amps to several micro amps, depending on the FIB instrument configuration and the application, and the pressure is typically controlled between $10^{-10}$ to $10^{-5}$ mbar in different parts of the system and in different operation modes.

A milling process can be done by, for example: (i) locating a location of interest that should be milled in order to remove a portion (e.g., a portion of one or more layers) of material from the sample, (ii) moving the sample (e.g., by the mechanical supporting element 140) so that the sample is located under the field-of-view of the FIB unit, and (iii) milling the sample to remove a desired amount of material in the location of interest. The milling process can include forming a recess in the sample (usually sized a few microns to few hundreds of microns in the lateral dimensions).

The milling process typically includes scanning a charged particle beam back-and-forth (e.g., in a raster or other scan pattern) across a particular area of the sample being imaged or milled. One or more lenses (not shown) coupled to the charged particle column can implement the scan pattern as is known to those of skill in the art. The area scanned is typically a very small fraction of the overall area of sample. For example, the sample can be a semiconductor wafer with a diameter of 150, 200 or 300 mm while each area scanned on the wafer (i.e., the area milled) can be a rectangular area having a width and/or length measured in microns or tens of microns. Each iteration (or frame) in which the ion beam is scanned across the region being milled is typically measured in microseconds and removes a very small amount of material (e.g., as low as 0.01 atomic layers using a low i-probe (e.g., 10 pA) or as much as 1000 atomic layers using a high i-probe (e.g., 1000 nA) such that the scan pattern is repeated many thousands or even millions of times to etch a hole to a desired depth.

During a milling operation the charged particle beam 120 generated by FIB column 120 propagates through the vacuumed environment formed within vacuum chamber 110 before impinging on sample 130. The milling process generates byproducts such as molecules, atoms and ions of the material being milled along with secondary electrons. For example, as an ion hits the sample surface with a relatively high energy level, the ion can begin a collision cascade that transfers momentum and energy from the ion to the sample until the ion is stopped and implanted. The momentum and energy transfer during the collision cascade can cause the dislocation of atoms, the ionization of atoms and the generation of phonons (heat). The cascade can reach the sample surface causing the sputtering of atoms having enough momentum and energy to escape the solid sample and generating secondary ions and electrons as a combination of ionization and sputtering that also escape the sample surface. The secondary ions or secondary electrons can be detected by an appropriate detector (not shown). The detected secondary ions or secondary electrons can then be used to analyze characteristics of the milled layers and the structure.

While not shown in FIG. 1, FIB system 100 can include one or more controllers, processors or other hardware units that control the operation of system 100 by executing computer instructions stored in one or more computer-readable memories as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

Charged Particle Enhanced Deposition Process

Some embodiments of the disclosure can deposit material over a sample positioned on support 140 by initiating a deposition process under FIB column 120. As an example, in some embodiments FIB column 120 can be used in a deposition mode to initiate a focused ion beam enhanced deposition process. Towards this end, a deposition gas can be supplied to the sample 130 by gas injection system 150 and energy from the FIB column 120 can generate a beam of ions 125. The cascade of impinging ions can, in turn, activate the deposition gas resulting in deposition of material on the sample that is localized to the regions of the sample that over which the ion beam is scanned. Thus, deposition that occurs according to such embodiments does not simultaneously occur across the entire surface of the sample or wafer being processed. Instead, deposition occurs only in the general areas where the ion beam (which, as a non-limiting example, can have a diameter in the range of 0.5 to 25 microns for a xenon plasma) impinges upon the wafer and as the ion beam is scanned across those areas of the wafer. Thus, deposition according to some embodiments can be carried out with micron level resolution.

The rate at which material is deposited in such a focused ion beam (FIB) enhanced deposition process can have a direct impact on the throughput of the process. Thus, higher deposition rates can equate to a higher throughput. During a FIB deposition process, the rate at which material is deposited over the sample depends on a number of different factors including the energy level of the charged particle beam, the type of material on the surface of the sample, the temperature of the sample surface and the precursor gas used for the deposition process.

The deposition rate can also be highly dependent on the gas flux from the gas injection nozzle opening and the gas concentration on the sample surface. For example, it is often an objective of a FIB enhanced deposition process to have the highest concentration of precursor gas molecules on the sample surface in the scanned location of the ion beam (called the interaction point). One system that has been designed to provide a high gas concentration is the doubly perforated nozzle design described in U.S. Pat. No. 6,992,288, which is incorporated by herein in its entirety for all purposes.

Figure 2:
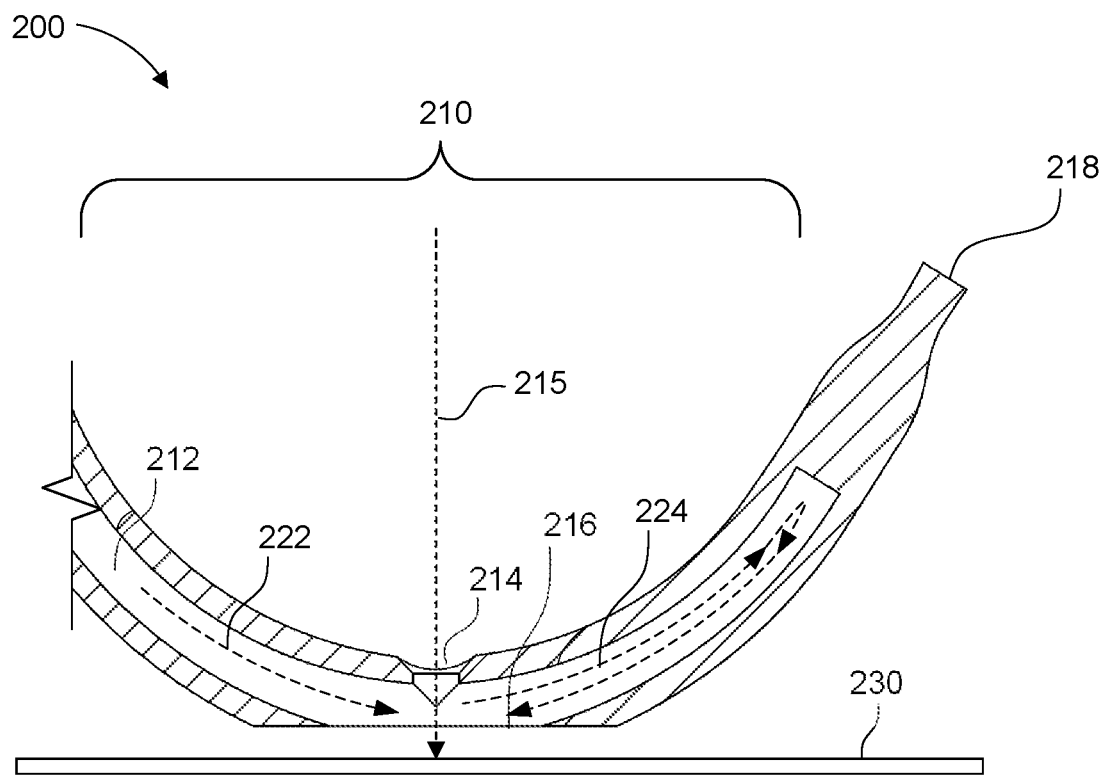
FIG. 2 is a simplified illustration of a previously known gas injection system.

FIG. 2 is a simplified illustration of an end portion of a gas nozzle 200 in accordance with the teachings of the '288 patent. As discussed in the '288 patent, gas nozzle 200 includes various portions of which only the end portion 210 is shown in FIG. 2. End portion 210 includes a gas conduit 212 that extends a length of the gas nozzle. Gas conduit 212 is the conduit through which one or more gases can be delivered by the gas injection system from, for example, a gas reservoir (not shown) to the reaction zone above a sample 230. As shown, end portion 210 has a u-shaped profile and includes first and second apertures 214, 216 that are positioned within the bottom portion of the u-shape. Aperture 214 is formed through an upper surface of gas conduit 210 and gas aperture 216 is formed through a bottom surface of the gas conduit. The apertures 214, 216 are aligned such as to define a space through which the primary electron beam or ion beam 215 can propagate.

Gas conduit 212 extends past the apertures 214, 216 terminating at a sealed end 218 of the gas nozzle. Gas conduit 212 is shaped within the end portion 210 such as to allow a first portion 222 of the gas flowing through conduit 212 to pass over and through second aperture 216 from a first direction and allow a second portion 224 of the gas flowing through conduit 212 to propagate towards the sealed end and to be returned back through gas conduit 212 and pass over and through the second aperture 216 from a second direction. First aperture 214 is designed to be smaller than the second aperture so that most of the gas should exit through the second aperture 216 (towards the surface of sample 230) rather than first aperture 214. Allowing a portion of the gas to flow past aperture 216 such that it is reflected back through the gas conduit in an opposite direction allows the gas to exit aperture 216 at substantially opposite directions.

While nozzle 200 is a large improvement over previously known gas nozzles for charged particle beam deposition, the curved, u-shaped nature of end portion 210 surrounding aperture 216 can result in some gas molecules arriving at aperture 216 with an average velocity in a somewhat downward trajectory angled away from the location of charged particle beam 215 as shown by arrows 222 and 224 which represent gas paths over and through the aperture 216. Additionally, if the gas flow at arrow 222 is higher than that at arrow 224, there can be a horizontal drift in the deposition rate of material deposited over sample 230 to the right of the point at which the ion beam collides with sample 230.

Improved Gas Injection Nozzle

Figure 3:
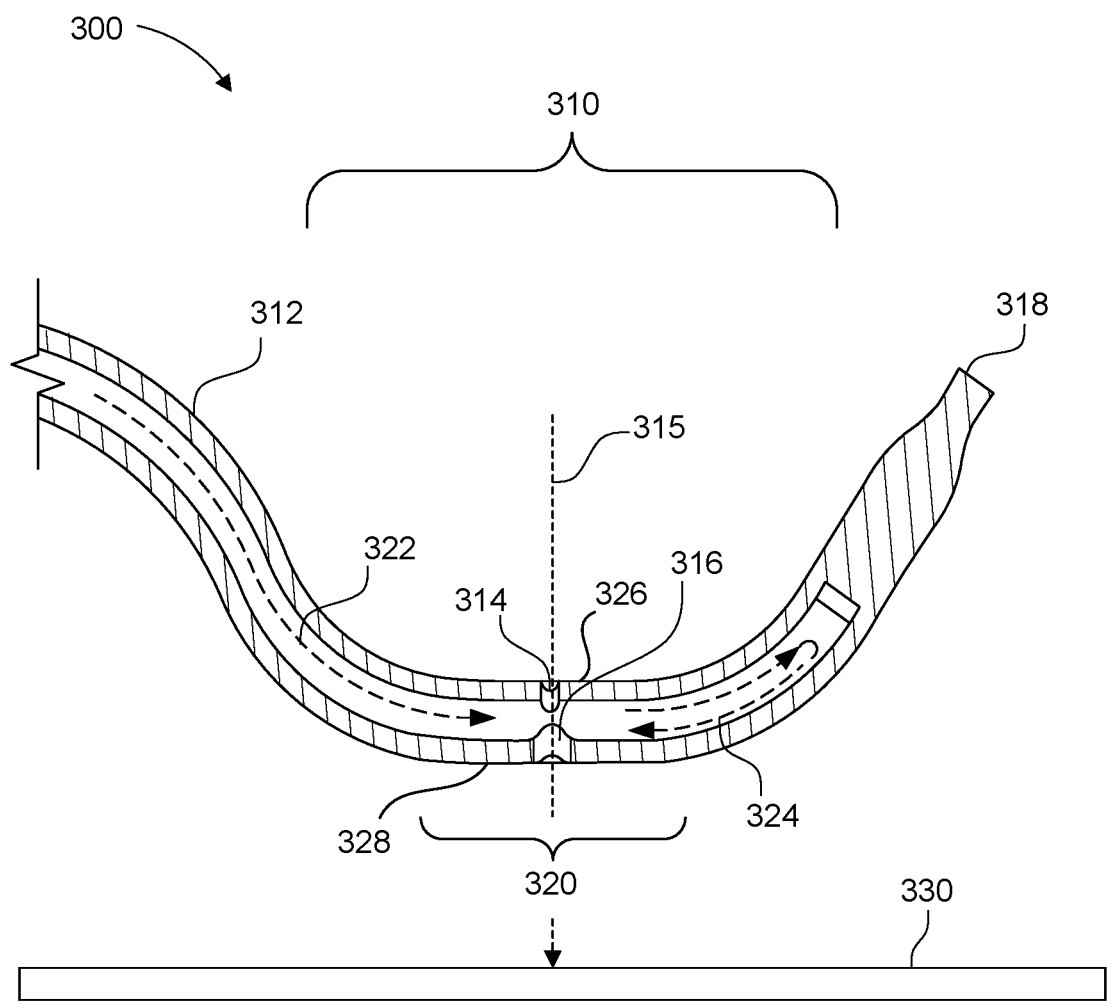
FIG. 3 is a simplified illustration of a portion of a gas injection system according to some embodiments disclosed herein.

Embodiments disclosed herein flatten the gas conduit in the area surrounding the bottom apertures so that gas molecules exit the aperture without any horizontal direction and so that deposition from the gas molecules is highest at the center of aperture 216 instead of off to the right side. Thus, embodiments described herein provide a gas injection system that further improves upon the teachings of the '288 patent. FIG. 3 is a simplified illustration of a gas injection nozzle 300 according to some embodiments disclosed herein that can be used in place of gas injection nozzle 200 in a charged particle deposition system, such as system 100 discussed above. Similar to nozzle 200, gas injection nozzle 300 includes various portions of which only an end portion 310 is shown in FIG. 3. End portion 310 includes a gas conduit 312 that, while not shown in FIG. 3, can extend a length of the gas nozzle. Gas conduit 312 can be similar to gas conduit 212 and is the conduit through which one or more gases can be delivered by the gas injection system from, for example, a gas reservoir (not shown) to the reaction zone above a sample 330.

As shown, end portion 310 also includes first and second apertures 314, 316. Aperture 314 is formed through an upper surface of gas conduit 310 and gas aperture 316 is formed through a bottom surface of the gas conduit. The apertures 314, 316 are aligned such as to define a space through which the primary electron beam or ion beam 315 can propagate. As described in more detail below, in some embodiments aperture 316, which, during a deposition process, is spaced directly over the sample, is considerably larger than aperture 314 to encourage gas that flows past the apertures to exit aperture 316 towards the sample. For example, in some embodiments, aperture 316 has a diameter that is twice as large as the diameter of aperture 314 (and thus an area that is four times as large).

Gas conduit 312 extends past the apertures 314, 316 terminating at a sealed end 318 of the gas nozzle. Thus, similar to gas conduit 212, gas conduit 312 is shaped within the end portion 310 such as to allow a first portion 322 of the gas flowing through conduit 312 to pass over and through second aperture 316 from a first direction and allow a second portion 324 of the gas flowing through conduit 312 to propagate towards the sealed end and to be returned back through gas conduit 312 and pass over and through the second aperture 316 from a second direction.

Figure 4A:
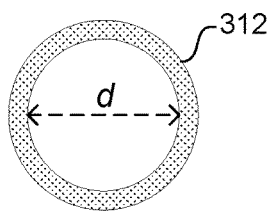
FIG. 4A is a simplified cross-sectional diagram of the gas conduit depicted in FIG. 3 according to some embodiments.
Figure 4B:
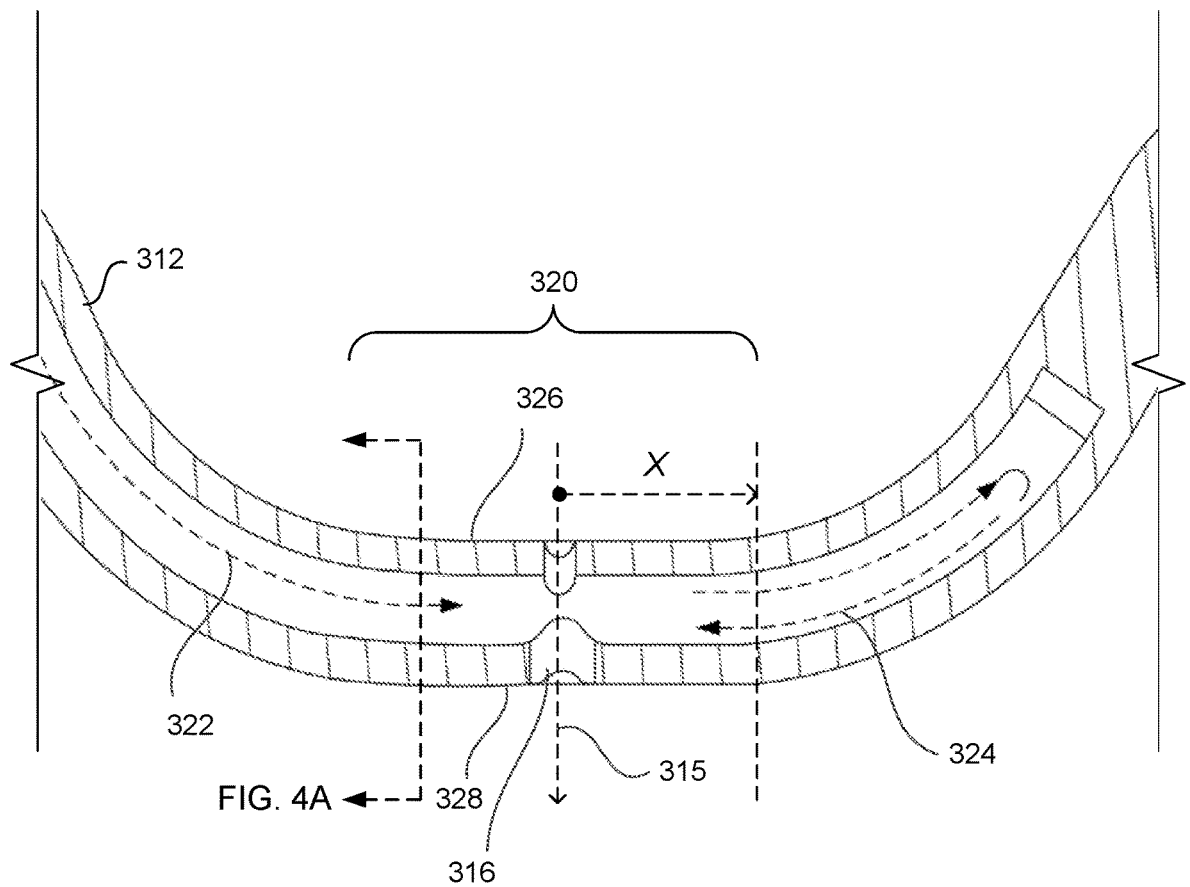
FIG. 4B is an expanded view of a portion of the gas conduit depicted in FIG. 3 according to some embodiments.

Unlike gas conduit 212, gas conduit 312 includes a section 320 that is completely flat for a predetermined distance on each side of aperture 316. The flat section 320 has opposing top and bottom surfaces 326, 328 that are horizontal and thus perpendicular to the charged particle beam 315. Accordingly, when the sample 330 is a flat semiconductor wafer, bottom surface 328 is spaced apart from and parallel to the sample surface. To illustrate, reference is made to FIGS. 4A and 4B where FIG. 4A is a simplified cross-sectional view of as can be better appreciated when referring to FIGS. 4A and 4B gas conduit 312 and FIG. 4B is an enlarged view of the flat portion 320 of the gas conduit. It is worth noting that FIGS. 4A and 4B are not drawn to scale. As shown in FIG. 4A, in some embodiments gas conduit 312 has a circular cross-section. In various implementations, the inner diameter (d) of gas conduit 312 can be between 300 and 1500 millimeters and in some implementations, the inner diameter (d) can be between 600 and 1000 mm.

As shown in FIG. 4B, flat section 320 extends a distance (X) on each side of the apertures 314, 316. In some embodiments, distance X is at least twice the diameter of gas conduit 312 and in some embodiments, distance X is at least three times the diameter of gas conduit 312. Flat section 320 forces gas flow through gas conduit 312 to be perpendicular to charged particle beam 315 (and perpendicular to the opening 316) creating a constant pressure throughout gas conduit 312 in the region of aperture 316. The constant pressure increases the gas flux downwards which results in gas exiting aperture 316 without any horizontal drift to the left or right of the aperture ensuring that the concentration of gas molecules exiting gas conduit 312 from aperture 316 is highest at, and symmetric around, the center of the aperture (the interaction point during a deposition process), which in turn, results in more precise deposition on the sample.

Additionally, in some embodiments apertures 314, 316 can be made smaller than apertures 214, 216. While embodiments described herein are not limited to any particular dimensions of apertures 314 and 316, as an illustrative example, in some embodiments aperture 314 has a diameter of 0.4 mm while aperture 316, which has a diameter twice as large as aperture 314, has a diameter of 0.8 mm. Since top aperture 314 is half as large as bottom aperture 316, most of the gas in conduit 312 will exit through the bottom aperture 316 towards the surface of sample 330 instead of exiting through top aperture 314.

Figure 4C:
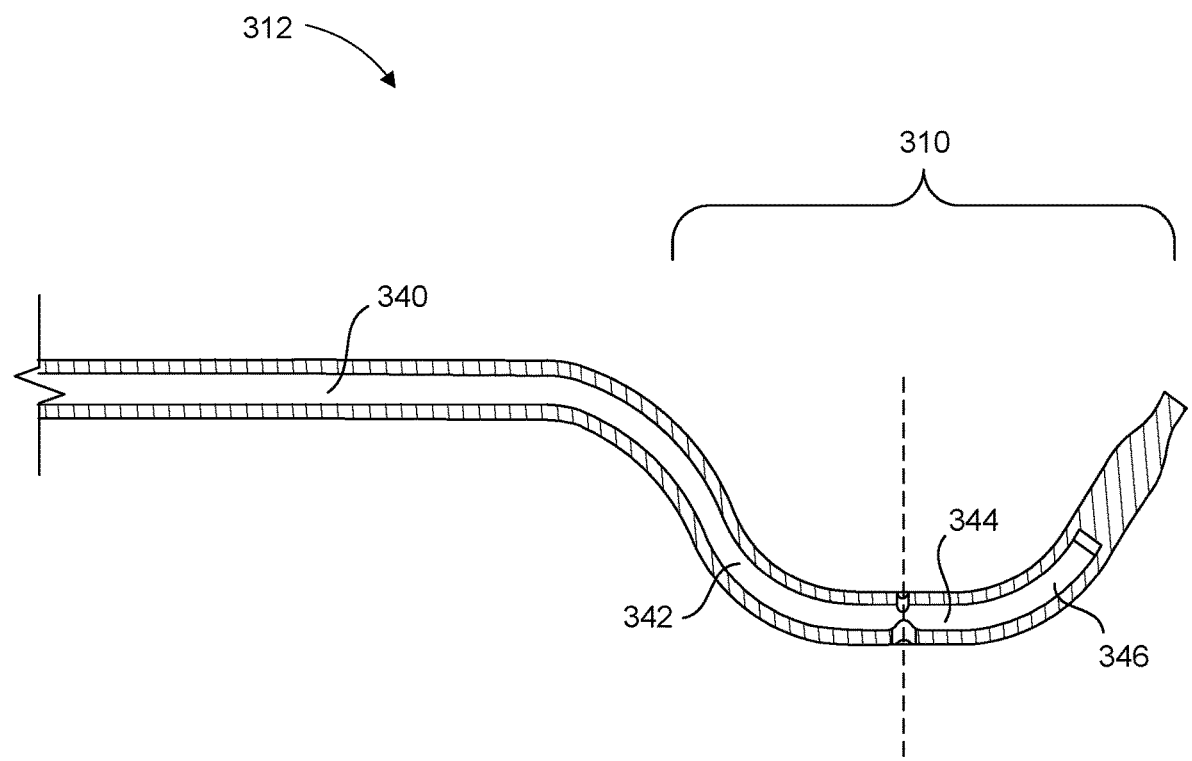
FIG. 4C is a simplified illustration of a portion of a gas injection system according to some embodiments disclosed herein.

In some embodiments, to further ensure that deposition from a deposition process is centered directly below aperture 316, gas conduit 312 can be symmetrically shaped in end portion 310 for electrostatic purposes so that the ion beam 315 is not undesirably reflected away from the center of aperture 316. To illustrate, reference is made to FIG. 4C, which is a simplified illustration of a portion of gas conduit 312 including both end portion 310 of gas injection nozzle 300 discussed above with respect to FIG. 3 and an intermediate (first) segment 340, which is not shown in FIG. 3. Intermediate segment 330 can extend between end portion 310 and one or more gas reservoirs, gas valves and other components of the gas injection system (none of which are shown in FIG. 4C). As depicted, the intermediate segment 340 includes a portion that lies in a plane that is above that of a bottom portion of end portion 310. A second gas conduit segment 342 that is part of end portion 310 fluidly couples the end portion with the intermediate segment 340 and creates a downward bend of gas conduit 312 prior to gas aperture 316. Second gas conduit segment 342 is fluidly coupled at its other end to a central gas conduit segment 344, which can include the flat section 320 of the gas conduit. The central conduit segment 344 can thus include a relatively long horizontal section as described above with apertures 314 and 316 formed within, and in some embodiments centered within, the central gas conduit portion.

As illustrated in FIG. 4C, end portion 310 can further include a third gas conduit segment 346 that mirrors the second gas conduit segment 342 creating an upward bend of gas conduit 312 after aperture 316 and central gas conduit 344. In some embodiments, gas conduit 312 can be made from the unitary piece of metal. The gas conduit segments 342 and 346 can each be part of gas conduit 312 and thus be part of the same unitary piece of metal. The two segments 342 and 346 are symmetric with each other and are fluidly coupled to and disposed on opposite sides of a central gas conduit portion 344. The symmetric arrangement of the second and third conduit segments 342, 346 provides improved electrostatic characteristics of the gas conduit 312 such that ion beam 315 is not undesirably reflected away from the center of aperture 316.

Reduction of the "Shadow Effect"

Figure 5A:
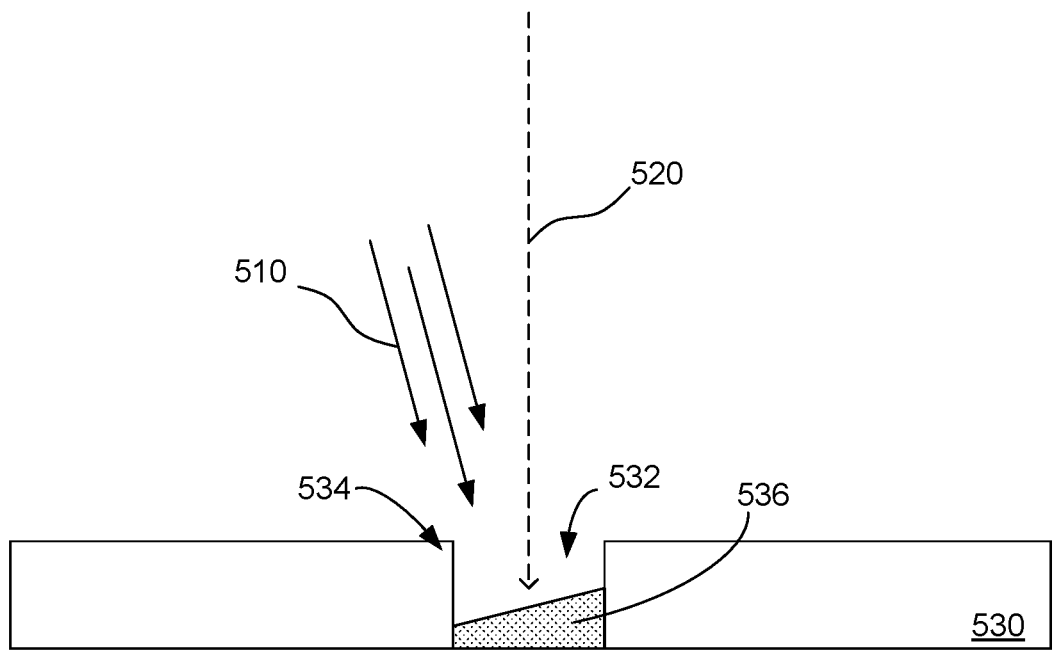
FIG. 5A is a simplified diagram illustrating an example of the shadow effect that can occur during a charged particle deposition operation performed with some previously known gas injection nozzles.

As mentioned above, gas injection nozzles according to the present disclosure, such as gas injection nozzle 300, can provide a gas flow that is highly symmetric around the interaction point between the charged particle beam and sample. The highly symmetric gas flow can reduce unwanted shadow effects that can otherwise occur with deposition from gas injection nozzles that impart a flux with a non-perpendicular angular component to it. To illustrate, reference is first made to FIG. 5A, which depicts localized focused ion beam deposition over a sample 530 using a prior art gas injection nozzle (not shown). As shown in FIG. 5A, sample 530 includes a trench 532 in which material is to be deposited by a FIB deposition process. Gas flow 510, however, has a slight angle with respect to ion beam 520. As a result of the angular flux of gas flow 510, corner 534 of trench 532 partially blocks some portion of the gas flow from reaching areas within the trench on the same side as corner 534. Thus, in effect, corner 534 creates "shadow" within the left side of trench 532 that results in deposited material 536 being thicker on the right side of the trench than on the left side.

Figure 5B:
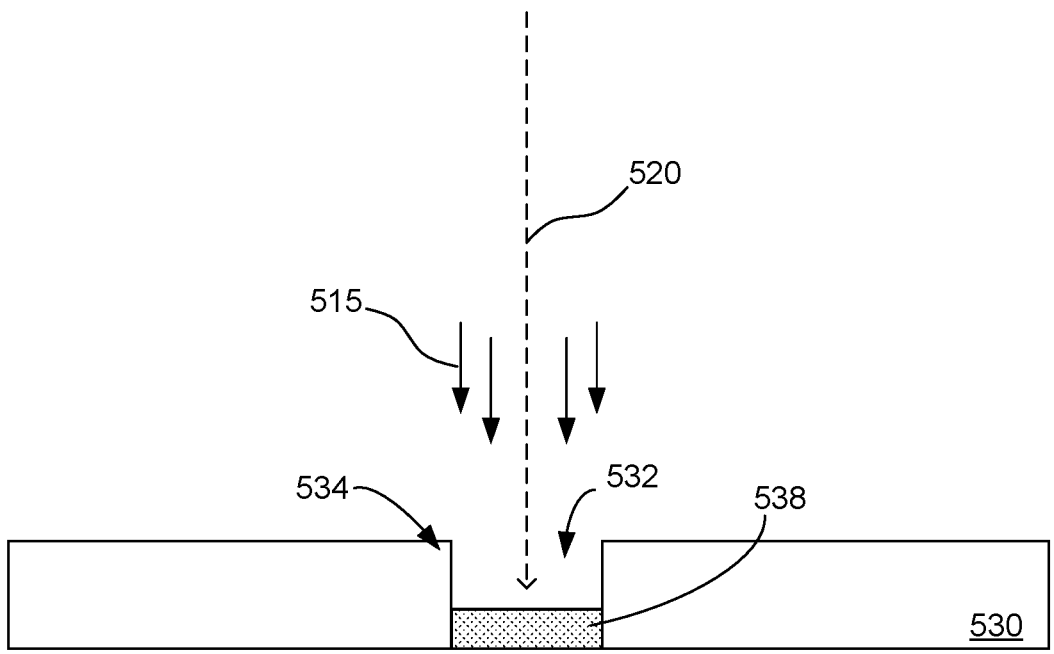
FIG. 5B is a simplified diagram illustrating the absence of the shadow effect in a charged particle deposition operation performed with a gas injection nozzle in accordance with embodiments disclosed herein.

FIG. 5B is a simplified illustration of a charged particle deposition process in accordance with the techniques described herein. As shown, a gas flow 515, which is highly symmetric and centered around the optical axis of ion beam 520, flows into trench 532 of sample 530 without having any portion of the gas flow blocked or otherwise shadowed by corner 534. As a result, material 538 deposited within the trench can have a uniform thickness throughout the trench.

While a comparison of FIG. 5A to FIG. 5B illustrates how embodiments disclosed herein provide improvements over previously known charged particle deposition processes with respect to the shadow effect when material is deposited within a trench, a person of skill in the art will appreciate that similar improvements can be obtained when a deposition process deposits a layer over a raised structure formed on a sample. For example, in such a scenario, the shadow effect imparted by the gas flow 510 in FIG. 5A can result in more deposition on a front side of the raised structure that comes in direct contact with the gas flow and less deposition on a back side of the structure that is "shadowed" from the gas flow by the structure itself. In contrast, the gas flow 515 shown in FIG. 5B can lessen and even eliminate the shadow effect in such situations since the gas flow is centered around and symmetric with the optical axis of ion beam 520.

Example FIB Deposition Process

Figure 6:
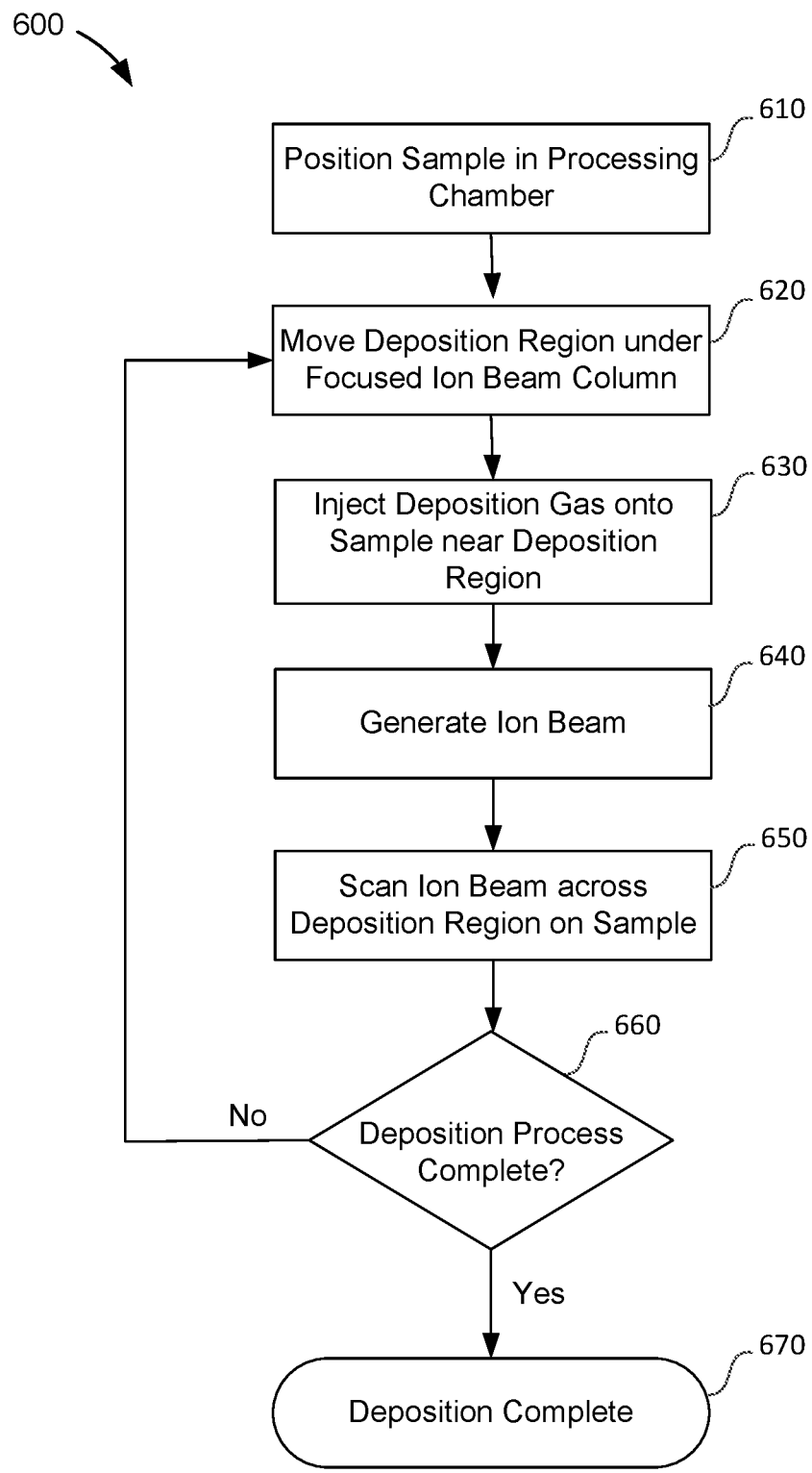
FIG. 6 is a flowchart depicting steps associated a method of depositing material over a sample using a focused ion beam according to some embodiments.
Figure 7:
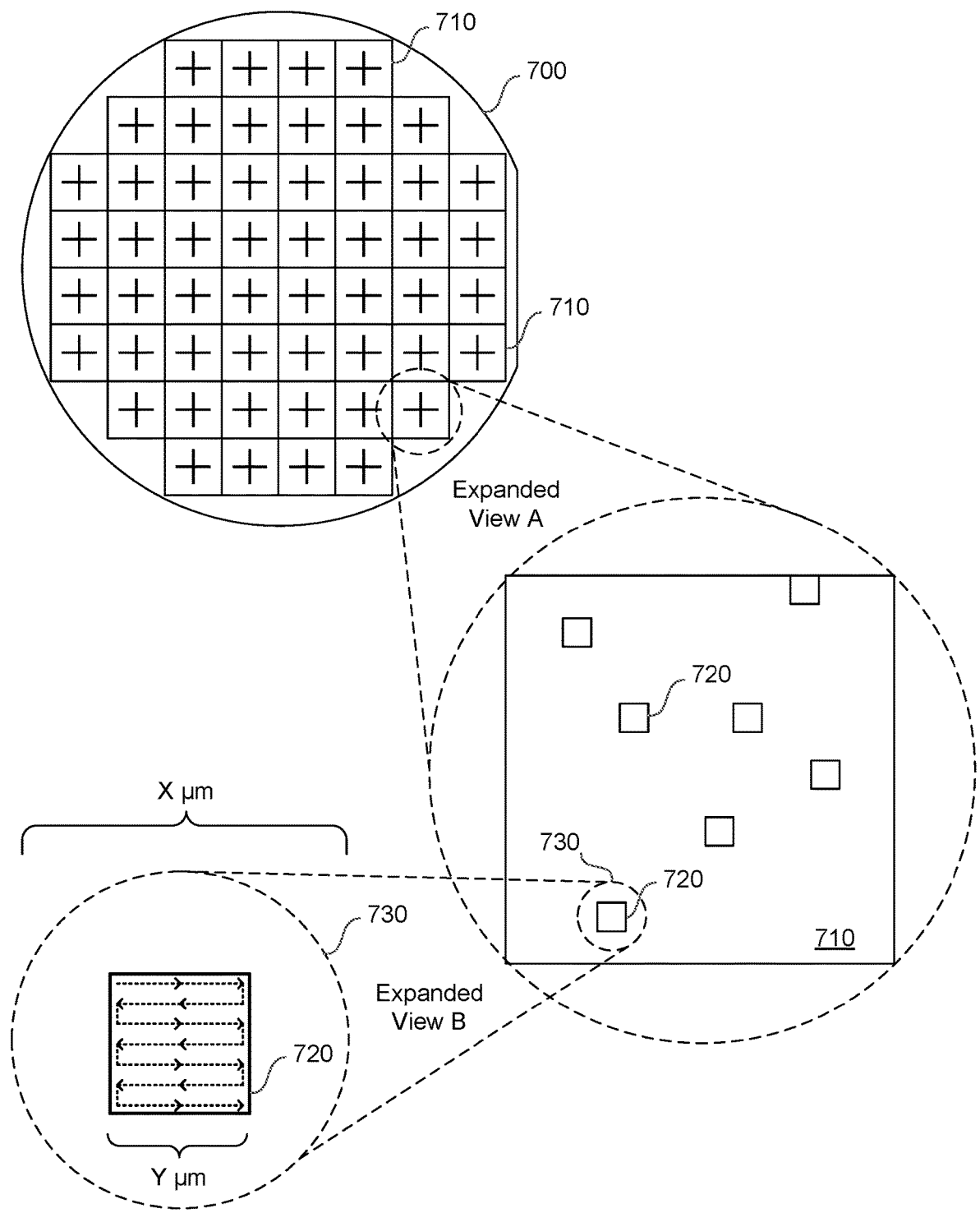
FIG. 7 is a simplified illustration of a sample that can have material deposited over portions of the sample in accordance with the embodiments disclosed herein.

To further illustrate embodiments of the disclosure, reference is made to FIGS. 6 and 7 where FIG. 6 is a flowchart depicting steps associated a method 600 according to some embodiments and FIG. 7 is a simplified illustration of a sample 700 that can be representative of sample 130. Material can be deposited on sample 700 via a charged particle beam enhanced deposition process in accordance with method 600. Method 600 starts by positioning a sample within a processing chamber of a sample evaluation system (block 610). The processing chamber, which can be, for example, chamber 100, can include one or more charged particle beam columns that can be operated in a deposition mode to deposit material over the sample 700 in one or more localized regions. Block 610 can include positioning sample 700 within the vacuum chamber on a sample support, such as support 140.

In many instances, sample 700 will include multiple different regions in which material is to be deposited. For example, FIG. 7 depicts a top view of a sample 700 along with two expanded views of specific portions of sample 700. Sample 700 can be, for example, a 150 mm, a 200 mm or a 300 mm semiconductor wafer, and can include multiple integrated circuits 710 (fifty two in the example depicted) formed thereon. The integrated circuits 710 can be at an intermediate stage of fabrication and method 600 can be used to deposit material over one or more regions 720 of the integrated circuits. For example, Expanded View A of FIG. 7 depicts multiple regions 720 of one of the integrated circuits 710 over which material can be deposited according to the techniques described herein. Expanded View B depicts one of those regions 720 in greater detail.

Referring back to FIG. 6, support 140 can be moved to position such that an area in which material is to be deposited over the sample (e.g., one of regions 720, referred to herein as a "deposition region") is placed directly under the tip of the focused ion beam column (step 620). Next, a deposition precursor gas can be injected into the chamber 110 at a location proximate the deposition region by, for example, gas injection system having a gas nozzle 300 in accordance with the present disclosure (step 630).

During step 630 molecules of the deposition precursor gas adhere to the surface of the sample in accordance with the sticking coefficient of the precursor gas. While gas is being delivered to the deposition region, the charged particle beam (e.g., an ion beam) can be generated (step 640) and focused and scanned across a region of interest on the sample (step 650). The charged particle beam can be focused by a focusing lens and scanned across a region of the substrate with one or more deflecting lenses (not shown). As discussed above, the cascade of charged particles from beam 125 can activate molecules of the deposition gas that have adhered to the sample in the deposition region resulting in deposition of material on the sample that is localized to the regions of the sample that over which the ion beam is scanned. For example, the charged particle beam can dissociate the precursor gas breaking the gas down into volatile and non-volatile components where the non-volatile component remains on the surface of the sample as deposited material. While embodiments can be used to deposit many different types of materials and are not limited to the use of any particular deposition precursor gas, as one specific example, the deposition precursor gas can be tungsten hexacarbonyl ($W(CO)_6$) that can be dissociated by the charged particle beam leaving a layer of tungsten material deposited on the sample within the localized deposition region.

In actual implementation, steps 640 and 650 can occur essentially simultaneously and very fast and step 630 can be maintained (i.e., deposition gas can be continuously introduced into the chamber) while the steps 650 and 660 are performed.

Once material from the precursor gas has been deposited in the first deposition, if there are additional areas on the sample in which material is to be deposited (step 660), the sample can be moved via the substrate support to position a next or subsequent deposition area under the tip of the charged particle column (block 620). If not, the deposition process is complete and the sample can be transferred out of system 100 or otherwise processed (step 670).

Additional Embodiments

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. For example, while the embodiments above described a focused ion column as part of a tool having a single charged particle column, in some embodiments the focused ion beam column can be positioned within a SEM-FIB tool that has both a scanning electron microscope column and a focused ion beam column.

Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings. It is, therefore, to be understood that the appended claims are intended to cover all such modifications and changes as fall within the true spirit of the embodiments of the disclosure.

Additionally, any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

Also, where the illustrated embodiments of the present disclosure can, for the most part, be implemented using electronic components and circuits known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

What is claimed is:

1. A gas injection nozzle that includes an elongated gas conduit comprising:
   a first gas conduit segment configured to be coupled with a gas reservoir;
   a second gas conduit segment fluidly coupled to the first gas conduit segment and defining a downward curve of the elongated gas conduit;
   a third gas conduit segment defining an upward curve of the elongated gas conduit that extends to a sealed end and is disposed in a mirrored relationship with at least a portion of the second gas conduit; and
   a central gas conduit segment coupled between the second and third gas conduit segments, the central gas conduit segment having a first aperture formed in an upper surface of the central gas conduit and a second aperture, larger than the first aperture, formed in a lower surface of the central gas conduit directly across from the first aperture, wherein the elongated gas conduit has an inner diameter along a portion of its length that includes at least the second, third and central gas conduit segments and wherein the central gas conduit segment includes a substantially horizontal portion that extends on each side of the first and second apertures for a distance that is at least twice the inner diameter of the gas conduit.

2. The gas injection nozzle set forth in claim 1 wherein the second aperture is has a diameter that is at least twice as large as a diameter of the first aperture.

3. The gas injection nozzle set forth in claim 1 wherein the substantially horizontal portion of the central gas conduit extends on each side of the first and second apertures for a distance that is at least three times the inner diameter of the gas conduit.

4. The gas injection nozzle set forth in claim 1 wherein the elongated gas conduit comprises stainless steel.

5. The gas injection nozzle set forth in claim 1 wherein an inner diameter of the elongated gas conduit is substantially constant throughout an entire length of the elongated gas conduit.

6. The gas injection nozzle set forth in claim 1 wherein the inner diameter of the elongated gas conduit is between 1500 and 300 microns.

7. The gas injection nozzle set forth in claim 1 wherein the inner diameter of the elongated gas conduit is between 1000 and 600 microns.

8. A system for depositing material over a sample in a localized region of the sample, the system comprising:
   a vacuum chamber;
   a sample support configured to hold a sample within the vacuum chamber during a sample evaluation process;
   a charged particle beam column configured to direct a charged particle beam into the vacuum chamber toward the sample such that the charged particle beam collides with the sample in a deposition region;
   a gas injection system configured to deliver a process gas to the deposition region of the sample, the gas injection system including an elongated gas conduit comprising:
      a first gas conduit segment configured to be coupled with a gas reservoir;
      a second gas conduit segment fluidly coupled to the first gas conduit segment and defining a downward curve of the elongated gas conduit;
      a third gas conduit segment defining an upward curve of the elongated gas conduit that extends to a sealed end and is disposed in a mirrored relationship with at least a portion of the second gas conduit; and
      a central gas conduit segment coupled between the second and third gas conduit segments, the central gas conduit segment having a first aperture formed in an upper surface of the central gas conduit and a second aperture, larger than the first aperture, formed in a lower surface of the central gas conduit directly across from the first aperture, wherein the elongated gas conduit has an inner diameter along a portion of its length that includes at least the second, third and central gas conduit segments and wherein the central gas conduit segment includes a substantially horizontal portion that extends on each side of the first and second apertures for a distance that is at least twice the inner diameter of the gas conduit.

9. The system set forth in claim 8 wherein the charged particle beam column is a focused ion beam column and the charged particle beam is a focused ion beam.

10. The system set forth in claim 8 wherein the second aperture is has a diameter that is at least twice as large as a diameter of the first aperture.

11. The system set forth in claim 8 wherein the substantially horizontal portion of the central gas conduit extends on each side of the first and second apertures for a distance that is at least three times the inner diameter of the gas conduit.

12. The system set forth in claim 8 wherein the elongated gas conduit comprises stainless steel.

13. The system set forth in claim 8 wherein the inner diameter of the elongated gas conduit is between 1500 and 300 microns.

14. A method of depositing material over a sample in a deposition region of the sample with a charged particle beam column, the method comprising:
    positioning a sample within a vacuum chamber such that the deposition region is under a field of view of the charged particle beam column;
    injecting a deposition precursor gas, with a gas injection system including an elongated gas conduit, into the vacuum chamber at a location adjacent to the deposition region;
    generating a charged particle beam with the charged particle beam column and focusing the particle beam within the deposition region of the sample; and
    scanning the focused particle beam across the deposition region of the sample to activate molecules of the deposition gas that have adhered to the sample surface in the deposition region and deposit material on the sample within the deposition region,
    wherein, the elongated gas conduit comprises:
        a first gas conduit segment configured to be coupled with a gas reservoir;
        a second gas conduit segment fluidly coupled to the first gas conduit segment and defining a downward curve of the elongated gas conduit;
        a third gas conduit segment defining an upward curve of the elongated gas conduit that extends to a sealed end and is disposed in a mirrored relationship with at least a portion of the second gas conduit; and
        a central gas conduit segment coupled between the second and third gas conduit segments, the central gas conduit segment having a first aperture formed in an upper surface of the central gas conduit and a second aperture, larger than the first aperture, formed in a lower surface of the central gas conduit directly across from the first aperture, wherein the elongated gas conduit has an inner diameter along a portion of its length that includes at least the second, third and central gas conduit segments and wherein the central gas conduit segment includes a substantially horizontal portion that extends on each side of the first and second apertures for a distance that is at least twice the inner diameter of the gas conduit.

15. The method of claim 14 wherein the charged particle beam column is a focused ion beam column and the charged particle beam is a focused ion beam.

16. The method of claim 14 wherein the second aperture is has a diameter that is at least twice as large as a diameter of the first aperture.

17. The method of claim 14 wherein the substantially horizontal portion of the central gas conduit extends on each side of the first and second apertures for a distance that is at least three times the inner diameter of the gas conduit.

18. The method of claim 14 wherein an inner diameter of the elongated gas conduit is substantially constant throughout an entire length of the elongated gas conduit.

19. The method of claim 14 wherein the inner diameter of the elongated gas conduit is between 1500 and 300 microns.

20. The method of claim 14 wherein the sample comprises a semiconductor wafer.

* * * * *